US005652812A

United States Patent [19]
Gurib et al.

[11] Patent Number: 5,652,812
[45] Date of Patent: Jul. 29, 1997

[54] INTEGRATED OPTO-ELECTRONIC COMPONENT

[75] Inventors: Salim Gurib, Arpajon; Joël Jacquet, Antony; Christine Labourie, Villejuif; Elisabeth Gaumont-Goarin, Chevreuse, all of France

[73] Assignee: ALCATEL N.V., Rijswijk, Netherlands

[21] Appl. No.: 691,327

[22] Filed: Aug. 2, 1996

[30] Foreign Application Priority Data

Aug. 4, 1995 [FR] France ................... 95 09541

[51] Int. Cl.⁶ ........................................ G02B 6/12
[52] U.S. Cl. ................................ 385/14; 372/50
[58] Field of Search .................... 372/20, 50, 90; 385/14

[56] References Cited

U.S. PATENT DOCUMENTS 5,537,432  7/1996  Mehuys et al. ............ 372/50
5,592,503  1/1997  Welch et al. ............... 372/50

FOREIGN PATENT DOCUMENTS

0409117A3  1/1991  European Pat. Off. .

OTHER PUBLICATIONS

Doussiere P. et al, "1.55 M Polarisation Independent Semiconductor Optical Amplifier with 25 DB Fiber to Fiber Gain", *IEEE Photonics Technology Letters*, vol. 6, No. 2, 1 Feb. 1994, pp. 170–172.

T. Durhuus et al, "High–speed all–optical amplifier structure", *Conference on Lasers and Electro–Optics* Anaheim, California, May 10–15 1992, Proceedings CLEO 1992, IEEE, NY.

Yasaka H. et al, "Broad–range Wavelength Conversion of 10 Gbit/s Signal Using a Superstructure Grating Distributed Bragg Reflector Laser" *Electronics Letters*, vol. 30, No. 2, 20 Jan. 1994, pp. 133/134.

Stubkjaer K. et al, "Semiconductor Optical Amplifiers as Linear Amplifiers, Gates & Wavelength Converters", *Proceedings of European Conference on Optical Communication*, Sep. 12–16, 1993, Invited Papers, vol. 1, 12 Sep. 1993, Swiss Electrotechnical Association, pp. 60–67.

R. Pedersen et al, "Simple wavelength converter for bit–rate–independent operation at data rates as high as 19 Gbit/s", pp. 249–250, OFC'94 san Jose, CA, Feb. 20–25, 1994, Proceedings vol. 4, 1994 Technical Digest Series, Optical Society of America, Washington.

S. Gurib et al, "Antireflection Coated Distributed Bragg Reflector Laser for all Optical Wavelength Conversion with Wavelength Insensitivity and Extinction Ratio Enhancement", *ECOC '94*, Firenze, Italy 25–29 Sep., Proceedings vol. 2, pp. 651–654.

P. Spano et al, "Frequency Conversion in Semiconductor Lasers and Amplifiers", *European Transactions on Telecommunications and Related Technologies*, vol. 5, No. 4, Jul. 1994–Aug. 1994, Milano, pp. 103–113.

B. Mikkelsen et al, "Penalty free wavelength conversion of 2.5 Gbit/s signals using a tuneable DBR–lasers", pp. 441–444, ECOC'92 Berlin, Germany, 27 Oct.–1 Nov. 1992, Proceedings, vol. 1.

(List continued on next page.)

*Primary Examiner*—John Ngo
*Attorney, Agent, or Firm*—Sughrue, Mion, Zinn, Macpeak & Seas

[57] ABSTRACT

An integrated opto-electronic component includes an amplifying segment coupled to a tuning segment to provide a wavelength tunable laser oscillator function insensitive to the polarization of optical waves that it receives. The amplifying segment is designed to be insensitive to polarization. The tuning segment includes a Bragg grating and a waveguide dimensioned to procure transversely monomode laser emission with rectilinear polarization. Applications include wavelength converters and stabilized gain amplifiers, in particular for optical transmission.

9 Claims, 2 Drawing Sheets

OTHER PUBLICATIONS

Braagaard C. et al, "Optimization of DBR Wavelength Converters", *Proceedings of the European Conference on Optical Communication*, Sep. 12–16, 1993 Regular Papers, vol. 2, 12 Sep. 1993, Swiss Electrotechnical Association, pp. 237–240.

Braagaard C. et al, "Modeling the DBR Laser Used as Wavelength Conversion Device", *Journal of Lightwave Technology*, vol. 12, No. 6, 1 Jun. 1994, pp. 943–951.

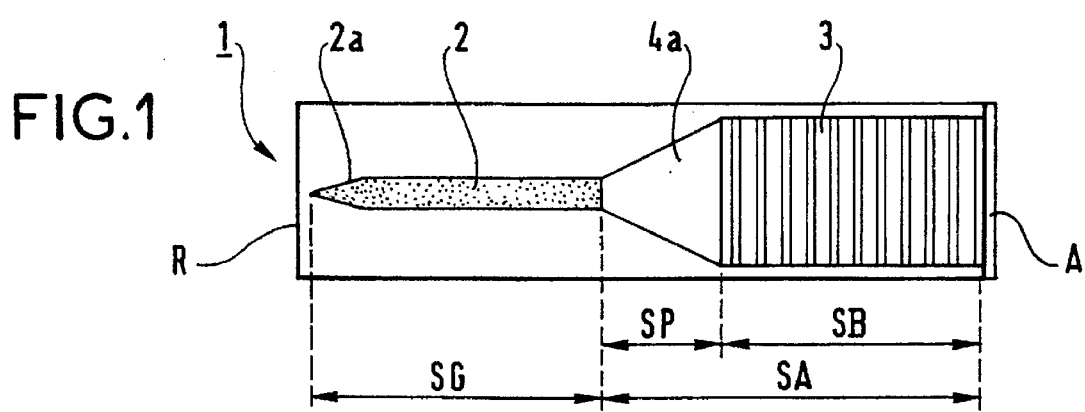
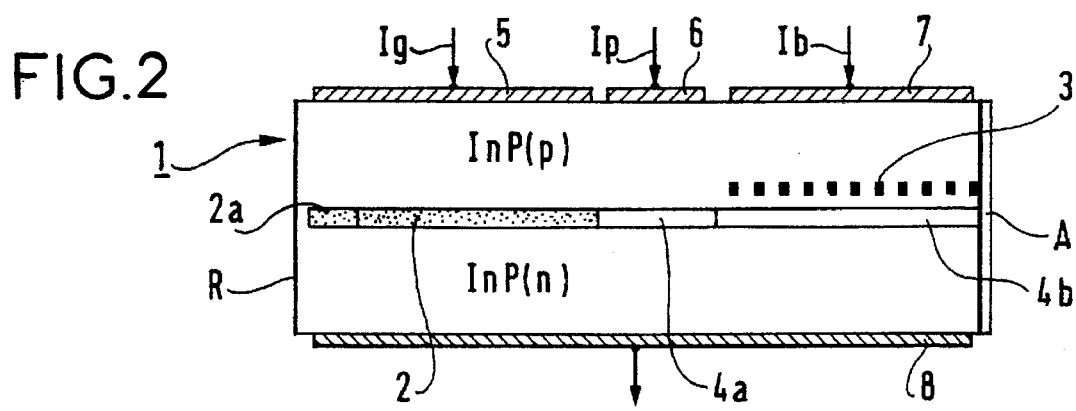
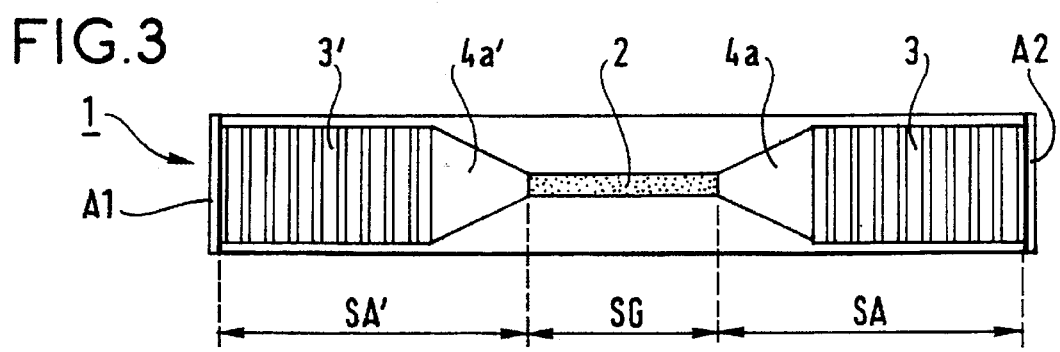
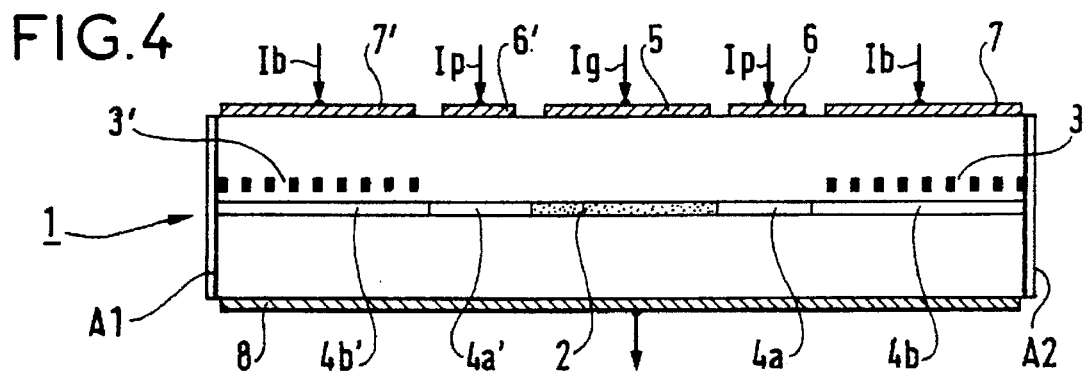

INTEGRATED OPTO-ELECTRONIC COMPONENT

BACKGROUND OF THE INVENTION

1. Field of the invention

The invention is in the field of integrated opto-electronic or photonic devices that can be used for transmitting or switching optical digital data. The invention is more particularly concerned with components having a saturable amplifying medium, i.e. exhibiting a carrier depletion phenomenon, for use as wavelength converters or stabilized gain amplifiers.

2. Description of the prior art

In optical transmission systems information is usually in the form of binary data represented by pulses modulating an optical carrier wave. To carry out wavelength multiplexing and demultiplexing operations, for example in space-time switching matrices, it is often necessary to be able to carry out wavelength conversion. Wavelength conversion consists in replacing the wavelength conveying received information with another, usually different wavelength to form an output wave with the same modulation as the input wave. This conversion is advantageously accompanied by amplification and reshaping of the signal.

To enable transmission at high bit rates it is desirable for the wavelength conversions to be carried out by exclusively optical means, i.e. without any optical-electronic conversion or vice versa.

A first constraint on wavelength converters is that they must supply a monomode output wave independent of the characteristics of the input wave. They must therefore be independent of the wavelength conveying the input signals. It is also desirable for their wavelength to be tunable electrically and independently of the polarization of the received waves. In optical transmission, signals are usually conveyed by optical fibers which always introduce some indeterminacy as to the polarization of the waves appearing at their output. A wavelength converter sensitive to the polarization of the input signal would therefore require a polarization sensitive device between the end of the fiber and the input of the converter. This solution would therefore be difficult to apply on an industrial scale.

A first way to avoid this problem is to exploit the saturable nature of semiconductor optical amplifiers. A constant power monomode auxiliary wave having a wavelength different from that of the input signal carrier is introduced into the amplifier at the same time as the input signal. The modulation of the input signal modulates the gain of the amplifier with the result that the auxiliary wave is modulated correspondingly, with the opposite phase. Independence of the polarization of the input signal can be obtained by making the amplifier insensitive to polarization, for example by the choice of appropriate geometrical dimensions for the active layer (substantially square cross-section) or using a strained quantum well structure. However, this solution allows only limited reshaping of the signals. Furthermore, the amplifier must be associated with a laser, which makes the system more complex and reduces its performance: additional coupling losses, higher cost.

Another possibility is to use the carrier depletion effect in a distributed Bragg reflector (DBR) laser. The wavelength of this component can be tuned but the component is sensitive to the polarization because of the active structure employed: strongly rectangular waveguide or polarization-sensitive quantum well.

Consideration could also be given to using a distributed feedback (DFB) laser oscillator, employing a substantially square cross-section amplifying medium to make it insensitive to polarization. The wavelength of this component cannot be tuned electrically, however, and since the amplifying medium is insensitive to polarization, the polarization of the laser emission is indeterminate. An output polarizer would therefore be required to obtain a transversely monomode wave. This type of component, already used as a stabilized gain amplifier, nevertheless offers improved performance in terms of control power.

An aim of the invention is to remedy the drawbacks of the previously mentioned solutions by proposing an integrated opto-electronic component offering the wavelength tunable laser source function and that can be used as a wavelength converter or as a stabilized gain amplifier insensitive to the polarization of the input wave.

SUMMARY OF THE INVENTION

To this end, the invention consists in an integrated opto-electronic component including an amplifying segment having a saturable optical amplifying medium and a tuning segment having an optical waveguide coupled to a first end of said amplifying medium, wherein said amplifying segment and said tuning segment are delimited by first and second reflectors, said first reflector is a Bragg grating placed in said tuning segment, said amplifying medium is dimensioned to have a gain substantially independent of the polarization of the optical waves that it receives and said optical waveguide of the tuning segment is dimensioned at the location of said Bragg grating to impose transversely monomode oscillation with rectilinear polarization.

The strained quantum well technique may be used to make the amplifying medium independent of the polarization of the waves received. This technique is difficult to use, however. It is easier to modify the geometry of the amplifying medium of the amplifying segment to impose a confinement factor independent of the directions concerned in each section of the medium. The ideal solution would naturally be for the active layer forming the amplifying medium to have a circular cross-section. In practise, for ease of fabrication, a substantially square cross-section will suffice.

Accordingly, in one preferred embodiment of the invention, said amplifying medium comprises an active layer having a substantially square cross-section, said tuning segment comprises a reflecting segment coupled to the amplifying segment by a phase segment, said reflecting segment includes said Bragg grating and an associated rectangular optical waveguide and said phase segment has an optical waveguide of varying width to provide the transition between the width of the active layer and the width of the optical waveguide of the reflecting segment.

The rectangular waveguide of the reflecting segment therefore imposes a transversely monomode oscillation mode, with a constant direction of polarization, while the phase segment provides the geometrical transition between the active layer of the amplifying medium and the waveguide of the reflecting segment. What is more, the presence of the phase segment enables fine adjustment of the oscillation wavelength by injection of an appropriate electrical current.

In a first embodiment, the second reflector comprises a semireflecting face at the second end of the amplifying segment.

In a different implementation providing better coupling between the component and an external optical fiber, the end of the amplifying medium near the semireflecting face is tapered.

In a second embodiment, the component includes a second tuning segment having an optical waveguide coupled to the second end of the amplifying segment and said second tuning segment has a structure symmetrical to that of the first tuning segment about the gain segment.

This latter arrangement has the advantage that reflection of the input signal by the face of the component receiving that signal can be reduced. Moreover, the rectangular shape of the waveguides at the faces of the component procures good coupling with external optical fibers.

In other aspects the invention consists in a wavelength converter using the component of the invention and a stabilized gain amplifier using the structure of the second embodiment of the component of the invention.

Other features and implementation aspects of the invention emerge from the remainder of the description given with reference to the figures.

BRIEF DESCRIPTION OF THE DRAWINGS

FIGS. 1 and 2 are diagrams showing a first embodiment of the component of the invention.

FIGS. 3 and 4 are diagrams showing a second embodiment of the component of the invention.

DETAILED DESCRIPTION OF THE PREFERRED EMBODIMENTS

Figure 5:
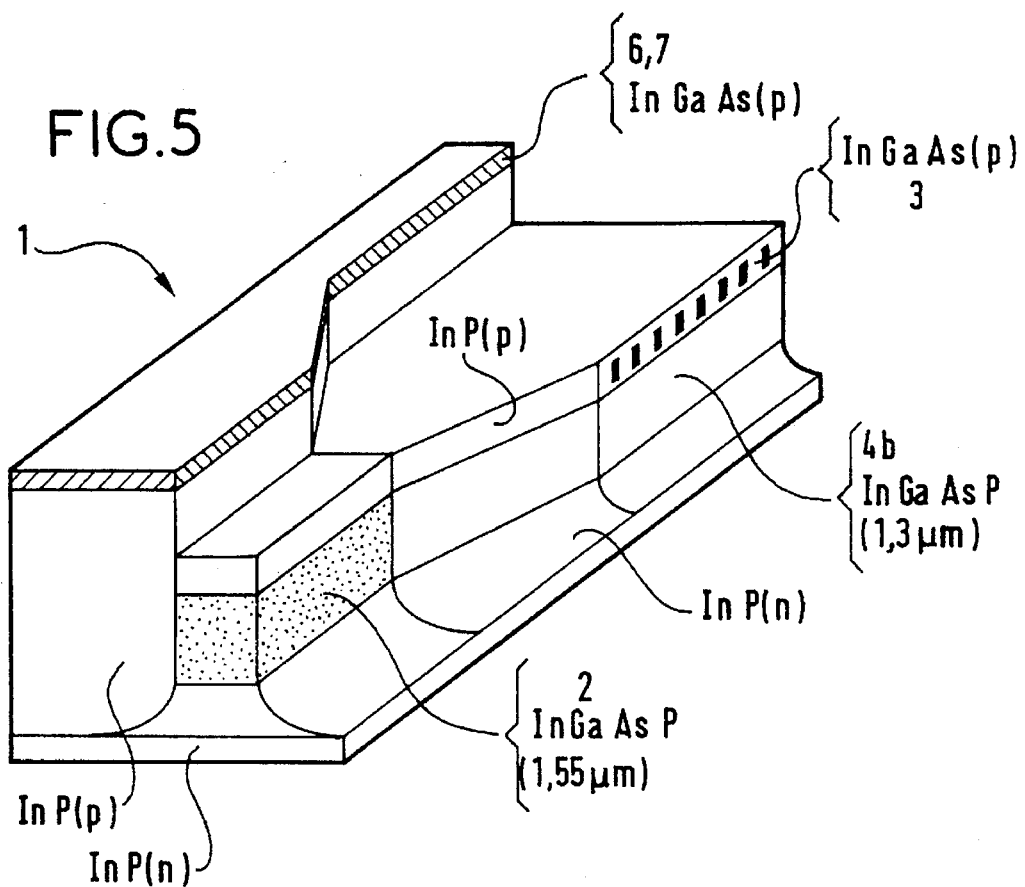
FIG. 5 is a partially cut away perspective view of the component showing the formation layers during fabrication.

The first embodiment of the component is shown diagrammatically in FIGS. 1 and 2, FIG. 1 being a top view and FIG. 2 a longitudinal section.

In this example the component 1 is fabricated on a n-doped InP semiconductor substrate. An active layer 2 of a quaternary InGaAsP alloy defining an amplification segment SG is deposited on the substrate. The active layer 2 has a substantially square cross-section and is extended by an optical waveguide having a width which first increases and then is constant. The portion of the waveguide 4a in which the width increases defines a phase segment and the portion 4b of constant width lies under a Bragg grating 3 to define a reflecting segment SB. The Bragg grating is formed in the P-doped InGaAsP layer above the waveguide 4b and produces a periodic variation in the index near the section 4b of the waveguide. The grating 3 is formed by holographic masking and chemical etching followed by epitaxial growth of p-doped InP.

The external end of the active layer 2 is extended by a taper 2a terminating near the face R of the component. The face R is semi-reflecting to form a resonant laser cavity with the Bragg grating. The opposite face A is advantageously antireflection treated to limit reflection of waves towards the face R.

Electrodes 5, 6, 7 on the top of the component respectively cover the segments SG, SP, SB. There is a common electrode 8 on the bottom of the component. The electrode 5 injects the amplification current Ig and the electrodes 6 and 7 inject currents Ip, Ib for adjusting the oscillation wavelength of the cavity.

FIGS. 3 and 4 are respectively a plan view and a longitudinal section of a second embodiment. It differs from the former embodiment merely in that the mirror function of the face R is replaced by a second tuning segment SA' coupled to the active layer and having a structure symmetrical to that of the first tuning segment SA about the gain segment SG. Corresponding additional electrodes 6', 7' are provided. In this embodiment, the resonant cavity being formed by two opposed Bragg gratings, the external faces A1, A2 of the component can be antireflection treated.

The partially cut away perspective view of FIG. 5 shows the various stages of the fabrication of the component. The same structural elements are shown as in the preceding figures, and the composition of the various layers is indicated.

Figure 6:
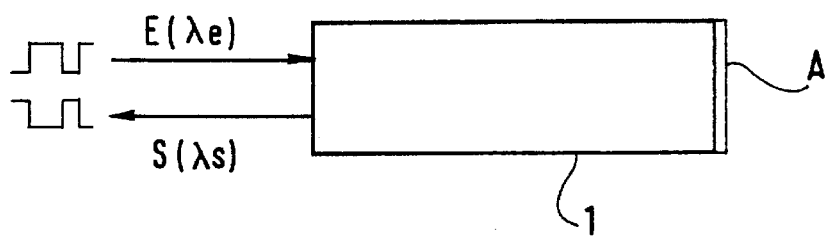
FIG. 6 illustrates the use of the component as a wavelength converter.

For simplicity the representation of the component in the figures does not show its real proportions. A typical real implementation has the following dimensions, for example:
 thickness of waveguide 4a, 4b: 0.3 µm
 thickness of layer 2: 0.4 µm
 thickness of layer 2: 0.5 µm
 width of waveguide 4b: 2.5 µm
 length of reflecting segment SB: 400–600 µm
 length of amplifying segment SG: 300–1 000 µm
 length of phase segment SP: 120 µm
 length of taper: 70 µm FIG. 6 shows the use of the component as a wavelength converter. In the first embodiment, the input signal E is applied to the semireflecting face R through which the output signal S leaves. The signal E is in the form of modulation of a carrier wave of wavelength λe. Its high level is assumed sufficient to saturate the amplifying medium (carrier depletion). Accordingly, when the level of the input signal is high that of the output signal is low and vice versa. The second embodiment can be used in an analogous way as a wavelength converter. The component being symmetrical, however, the input signal can be applied to either face.

Figure 7:
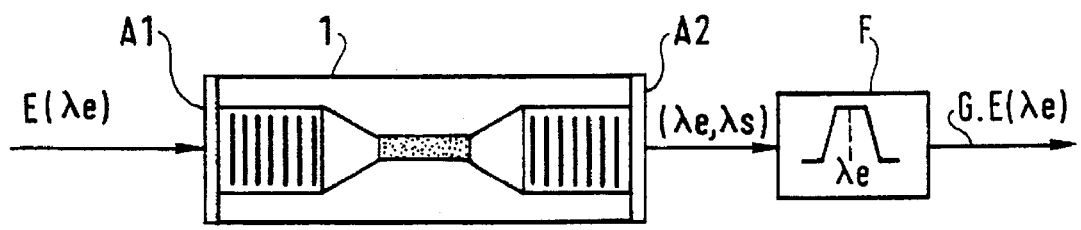
FIG. 7 illustrates the use of the component as a stabilized gain amplifier.

FIG. 7 shows the use of the second embodiment of the component as a stabilized gain amplifier. In this case the input signal E is applied to one face A1. The output wave leaving through the face A2 is applied to a filter F tuned to the wavelength λe of the input signal carrier.

There is claimed:

1. An integrated opto-electronic component including an amplifying segment having a saturable optical amplifying medium and a tuning segment having an optical waveguide coupled to a first end of said amplifying medium, wherein
   said amplifying segment and said tuning segment are delimited by first and second reflectors, said first reflector is a Bragg grating placed in said tuning segment, said amplifying medium is dimensioned to have a gain substantially independent of the polarization of the optical waves that it receives and said optical waveguide of said tuning segment is dimensioned at the location of said Bragg grating to impose transversely monomode oscillation with rectilinear polarization.

2. A component as claimed in claim 1 wherein said amplifying medium comprises an active layer having a substantially square cross-section, said tuning segment comprises a reflecting segment coupled to said amplifying segment by a phase segment, said reflecting segment includes said Bragg grating and an associated rectangular optical waveguide and said phase segment has an optical waveguide of varying width to provide the transition between the width of said active layer and the width of said optical waveguide of said reflecting segment.

3. A component as claimed in claim 1 wherein said second reflector comprises a semireflecting face at the second end of said amplifying segment.

4. A component as claimed in claim 3 wherein the end of said amplifying medium near said semireflecting face is tapered.

5. A component as claimed in claim 3 wherein the external face of said tuning segment is antireflection treated.

6. A component as claimed in claim 1 including a second tuning segment having an optical waveguide coupled to the second end of said amplifying segment and wherein said second tuning segment has a structure symmetrical to that of said first tuning segment about said gain segment.

7. A component as claimed in claim 6 wherein the external faces of said tuning segments are antireflection coated.

8. A wavelength converter adapted to supply an output optical wave modulated in accordance with a modulated input optical wave and having a wavelength different than that of said input optical wave, said wavelength converter comprising an opto-electronic component as claimed in any one of the preceding claims wherein said output wavelength is imposed by said Bragg grating and said input signal is applied to the face of said component opposite said tuning segment.

9. Stabilized gain optical amplifier comprising a component as claimed in claim 6.

* * * * *